US012783034B2

(12) United States Patent
Sato et al.

(10) Patent No.: US 12,783,034 B2
(45) Date of Patent: Nov. 3, 2026

(54) INFORMATION PROCESSING DEVICE, INFORMATION PROCESSING METHOD, AND PROGRAM FOR EXTRACTING REPRESENTATIVE POWER LOADS FROM A GROUP OF POWER LOADS DERIVED FROM TIME-SERIES DATA OF POWER OF AN ENERGY STORAGE DEVICE

(71) Applicant: GS YUASA INTERNATIONAL LTD., Kyoto (JP)

(72) Inventors: Shuhei Sato, Kyoto (JP); Nan Ukumori, Kyoto (JP); Ayaka Kagami, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 81 days.

(21) Appl. No.: 18/850,481

(22) PCT Filed: Mar. 13, 2023

(86) PCT No.: PCT/JP2023/009480
§ 371 (c)(1),
(2) Date: Sep. 24, 2024

(87) PCT Pub. No.: WO2023/182019
PCT Pub. Date: Sep. 28, 2023

(65) Prior Publication Data

US 2025/0216917 A1 Jul. 3, 2025

(30) Foreign Application Priority Data

Mar. 25, 2022 (JP) ................................ 2022-050394
Mar. 25, 2022 (JP) ................................ 2022-050395

(51) Int. Cl.
*G06F 1/28* (2006.01)
*G01R 31/367* (2019.01)
(Continued)

(52) U.S. Cl.
CPC ............ *G06F 1/28* (2013.01); *H01M 10/425* (2013.01); *H02J 7/80* (2026.01); *G01R 31/367* (2019.01);
(Continued)

(58) Field of Classification Search
CPC ....... G06F 1/28; G01R 31/367; G01R 31/382; H01M 10/425; H01M 10/482;
(Continued)

(56) References Cited

U.S. PATENT DOCUMENTS

2013/0013235 A1 1/2013 Takahashi
2013/0013236 A1* 1/2013 Takahashi ............ G01R 31/367 702/63
(Continued)

FOREIGN PATENT DOCUMENTS

JP 2013-019730 A 1/2013
JP 2015-121520 A 7/2015
(Continued)

OTHER PUBLICATIONS

International Search Report and Written Opinion for Patent Cooperation Treaty Application No. PCT/JP2023/009480, dated May 23, 2023, 8 pages.

*Primary Examiner* — Terrell S Johnson
(74) *Attorney, Agent, or Firm* — Buchalter LLP

(57) ABSTRACT

An information processing device includes an acquisition unit that acquires a power load indicating time-series data of power of an energy storage device in a first period, a classification unit that classifies each power load obtained by dividing a power load acquired by the acquisition unit for each second period shorter than the first period into a plurality of groups, and an extraction unit that extracts, for each group classified by the classification unit, a represen-
(Continued)

tative power load from among power loads for each second period belonging to each group.

12 Claims, 10 Drawing Sheets

(51) Int. Cl.

| | |
|---|---|
| ***G01R 31/382*** | (2019.01) |
| ***H01M 10/42*** | (2006.01) |
| ***H01M 10/48*** | (2006.01) |
| ***H02J 3/32*** | (2026.01) |
| ***H02J 7/40*** | (2026.01) |
| ***H02J 7/80*** | (2026.01) |
| ***H02J 7/82*** | (2026.01) |

(52) U.S. Cl.
CPC ... *G01R 31/382* (2019.01); *H01M 2010/4271* (2013.01); *H01M 10/482* (2013.01); *H02J 3/32* (2013.01); *H02J 7/40* (2026.01); *H02J 7/82* (2026.01)

(58) Field of Classification Search
CPC ...... H01M 2010/4271; H02J 3/32; H02J 7/40; H02J 7/80; H02J 7/82
See application file for complete search history.

(56) References Cited

U.S. PATENT DOCUMENTS

| | | | | |
|---|---|---|---|---|
| 2020/0292620 | A1* | 9/2020 | Takahashi .......... | G01R 31/3648 |
| 2021/0033680 | A1* | 2/2021 | Ukumori .............. | G01R 31/392 |
| 2022/0187377 | A1 | 6/2022 | Takahashi et al. | |

FOREIGN PATENT DOCUMENTS

| | | | |
|---|---|---|---|
| JP | 2015-212848 | A | 11/2015 |
| JP | 2020-148560 | A | 9/2020 |
| JP | 2020-190876 | A | 11/2020 |
| JP | 2021-157926 | A | 10/2021 |

* cited by examiner

INFORMATION PROCESSING DEVICE, INFORMATION PROCESSING METHOD, AND PROGRAM FOR EXTRACTING REPRESENTATIVE POWER LOADS FROM A GROUP OF POWER LOADS DERIVED FROM TIME-SERIES DATA OF POWER OF AN ENERGY STORAGE DEVICE

CROSS REFERENCE TO RELATED APPLICATIONS

This application is a National Stage Application, filed under 35 U.S.C. § 371, of International Application No. PCT/JP2023/009480, filed Mar. 13, 2023, which international application claims priority to and the benefit of Japanese Application No. 2022-050394, filed Mar. 25, 2022 and Japanese Application No. 2022-050395, filed Mar. 25, 2022; the contents of all of which are hereby incorporated by reference in their entirety.

BACKGROUND

Technical Field

The present invention relates to an information processing device, an information processing method, and a program.

Description of Related Art

An energy storage device is widely used in an uninterruptible power system, a DC or AC power supply device included in a stabilized power supply, and the like. Further, use of energy storage devices in large-scale power systems that store renewable energy or power generated by an existing power generating system is also expanding.

It is known that by repeating charge-discharge, deterioration of an energy storage device progresses and full charge capacity gradually decreases. In order to estimate capacity transition such as prediction of progress of future deterioration and prediction of life in an energy storage device, it is required to grasp a power load of the energy storage device. JP-A-2015-121520 discloses a technique for accurately predicting progress of deterioration and a life of a storage battery by improving accuracy of a deterioration rate prediction value corresponding to a plurality of use conditions of the storage battery.

BRIEF SUMMARY

Energy storage devices such as a lead-acid battery and a lithium ion battery are increasingly applied to industrial applications other than in-vehicle applications (automotive application, motorcycle application). Capacity transition of an energy storage device is performed using a measurement result of a power load on the energy storage device for a certain period. In an energy storage device for in-vehicle applications, a power load for each charge-discharge cycle can be easily measured through a vehicle electronic control unit (ECU) or the like mounted on a vehicle.

On the other hand, in an energy storage device for industrial applications such as a solar power generating system, it is important to measure a power load over a relatively long period such as one year, half a year, or one month instead of a short period such as a charge-discharge cycle in order to accurately predict a life. Currently, in an energy storage device for industrial applications, information useful for analysis of such an energy storage device has not been acquired.

Further, capacity transition of an energy storage device can be estimated by giving a measurement result of a power load on the energy storage device for a certain period. In a case where a measurement result of a certain period is directly used, it is difficult to appropriately estimate capacity transition when usage of an energy storage device changes, that is, when a power load fluctuates from the measurement result of the certain period. In order to estimate appropriate capacity transition, it is required to generate a power load according to a use aspect of an energy storage device.

An object of the present disclosure is to provide an information processing device and the like capable of acquiring information useful for analysis of an energy storage device, particularly, analysis of capacity transition. Further, an object of the present disclosure is to provide an information processing device and the like capable of generating a power load according to a use aspect of an energy storage device.

An information processing device according to one aspect of the present disclosure includes an acquisition unit that acquires a power load indicating time-series data of power of an energy storage device in a first period, a classification unit that classifies each power load obtained by dividing a power load acquired by the acquisition unit for each second period shorter than the first period into a plurality of groups, and an extraction unit that extracts, for each group classified by the classification unit, a representative power load from among power loads for each second period belonging to each group.

An information processing device according to one aspect of the present disclosure includes an acquisition unit that acquires a plurality of representative power loads extracted from among power loads obtained by dividing a power load indicating time-series data of power of an energy storage device in a first period for each second period shorter than the first period, and a generation unit that generates a virtual power load in the first period by combining a plurality of representative power loads acquired by the acquisition unit.

According to the present disclosure, it is possible to acquire information useful for analysis of an energy storage device, particularly, analysis of capacity transition. Further, according to the present disclosure, it is possible to generate a power load according to a use aspect of an energy storage device.

DETAILED DESCRIPTION OF VARIOUS EMBODIMENTS

Figure 1:
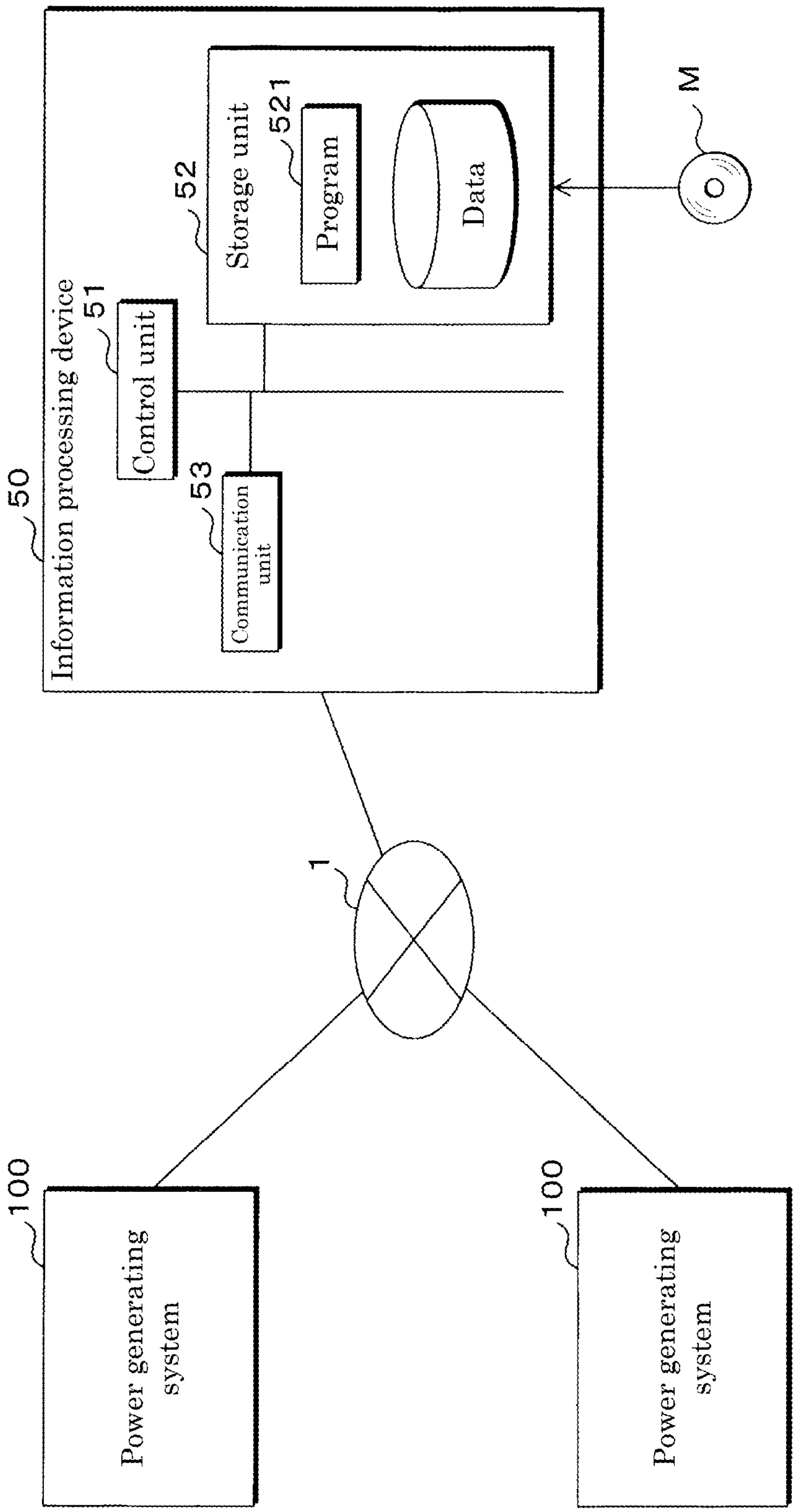
FIG. 1 is a diagram illustrating a configuration example of an information processing device.

An information processing device includes an acquisition unit that acquires a power load indicating time-series data of power of an energy storage device in a first period, a classification unit that classifies each power load obtained by dividing time-series data of a power load acquired by the acquisition unit for each second period shorter than the first period into a plurality of groups, and an extraction unit that extracts, for each group classified by the classification unit, a representative power load from among power loads for each second period in each group.

The information processing device acquires a power load of an energy storage device in the first period. The information processing device can acquire and provide a representative power load in an energy storage device by analyzing the acquired power load.

The power load is information indicating time-series data of power in an energy storage device. The power load may be acquired by obtaining time-series data of a current value and a voltage value of an energy storage device. The power load in the first period acquired by the information processing device is divided for each second period. The first period is a relatively long period, and may be, for example, one year, two years, half a year, one month, or the like. The second period is a period shorter than the first period, and may be, for example, one day, one hour, or the like.

The information processing device classifies each power load for each second period into a plurality of groups, and extracts a representative power load in each group. The representative power load indicates a representative power load pattern of an energy storage device. The representative power load can be used as information useful for analysis of an energy storage device, particularly for analysis of capacity transition.

The representative power load is an important input factor when life prediction of an energy storage device is performed. By using an obtained representative power load, it is possible to perform accurate life prediction in accordance with a current use condition of an energy storage device. Furthermore, a virtual power load can be generated by combining or processing a plurality of obtained representative power loads. By generating a virtual power load, it is possible to express a power load according to various use aspects.

Life prediction of an energy storage device is performed by using a power load and temperature data of a predetermined period. For example, a power load for one year obtained from operation data of an energy storage device is given to a prediction model, and a deterioration amount of the energy storage device is calculated, so that a life of the energy storage device after several years is predicted. At that time, a power load obtained from operation data is assumed to continue in following years, and the same power load is used for the following years, so that one life prediction result is derived.

Usage of an energy storage device is expected to change in the future. In conventional life prediction, prediction accuracy decreases when a power load of an energy storage device changes. By generating a virtual power load, the information processing device enables life prediction reflecting a change in a power load, and can improve accuracy of life prediction. By generating various virtual power loads, a range of life prediction is widened.

The classification unit may classify power loads for each second period into a plurality of groups by using a classification model generated by machine learning of a plurality of power loads. By using a classification model, it is possible to efficiently and accurately execute group classification according to a characteristic of each power load.

The extraction unit may extract the representative power load based on a mode of a total energization power amount of a power load in each second period in each group. The extraction unit extracts, for example, a power load corresponding to a most frequent total energization power amount among a plurality of power loads classified into each group as a representative power load. It is possible to extract a power load that suitably reflects behavior of a power load in each group.

In an information processing method, a computer executes processing of acquiring a power load indicating time-series data of power of an energy storage device in a first period, classifying each power load obtained by dividing an acquired power load for each second period shorter than the first period into a plurality of groups, and extracting, for each classified group, a representative power load from among power loads for each second period in each group.

A program causes a computer to execute processing of acquiring a power load indicating time-series data of power of an energy storage device in a first period, classifying each power load obtained by dividing an acquired power load for each second period shorter than the first period into a plurality of groups, and extracting, for each classified group, a representative power load from among power loads for each second period in each group.

An information processing device includes an acquisition unit that acquires a plurality of representative power loads extracted from among power loads obtained by dividing a power load indicating time-series data of power of an energy storage device in a first period for each second period shorter than the first period, and a generation unit that generates a virtual power load in the first period by combining a plurality of representative power loads acquired by the acquisition unit.

The information processing device generates a new virtual power load by using a plurality of representative power loads extracted from a power load of an energy storage device in the first period. The virtual power load is a virtual power load of an energy storage device in the first period.

The power load is information indicating time-series data of power in an energy storage device. The power load may be acquired by obtaining time-series data of a current value and a voltage value of an energy storage device. The power load in the first period acquired by the information processing device is divided for each second period. The first period is a relatively long period, and may be, for example, one year, two years, half a year, one month, or the like. The second period is a period shorter than the first period, and may be, for example, one day, one hour, or the like.

The representative power load is a representative power load of each group in a case where each power load for each second period is classified into a plurality of groups. By combining a plurality of the representative power loads, a virtual power load is generated. By generating a virtual power load by using a representative power load indicating a current use state of an energy storage device, it is possible to express a power load according to various use aspects.

Life prediction of an energy storage device is performed by using a power load and temperature data of a predetermined period. For example, a power load for one year obtained from operation data of an energy storage device is given to a prediction model, and a deterioration amount of the energy storage device is calculated, so that a life of the energy storage device after several years is predicted. At that time, a power load obtained from operation data is assumed to continue in following years, and the same power load is used for the following years, so that one life prediction result is derived.

Usage of an energy storage device is expected to change in the future. In conventional life prediction, prediction accuracy decreases when a power load of an energy storage device changes. By generating a virtual power load, the information processing device enables life prediction reflecting a change in a power load, and can improve accuracy of life prediction. By generating various virtual power loads, a range of life prediction is widened.

The generation unit may combine each representative power load based on appearance probability of each representative power load in a first period. According to the above configuration, appearance probability of each representative power load can be reflected in a virtual power load. A virtual power load can be easily and appropriately generated by assuming desired usage of an energy storage device and appropriately setting appearance probability.

The generation unit may generate a plurality of patterns of virtual power loads by varying appearance probability of each representative power load in a first period. Since various virtual power loads can be efficiently generated by changing appearance probability of each representative power load, a wide range of life prediction assuming various use aspects of the user can be performed.

The information processing device may further include a random number generation unit that generates a random number, and the generation unit may combine the representative power load based on a random number generated by the random number generation unit. According to the above configuration, it is possible to efficiently generate a virtual power load capable of expressing a large number of power load patterns by reflecting a use record of an energy storage device in a virtual power load by using each representative power load and randomly changing a power load by applying a random number.

The random number generation unit may generate the random number based on a length of a first period with respect to a second period, a type of a representative power load, and appearance probability in the first period of each representative power load. According to the above configuration, a state of each representative power load in one power load can be suitably reflected in a random number. By optionally changing each element in a random number, it is possible to easily generate a virtual power load corresponding to the user's desire.

The representative power load may be extracted for each group obtained by classifying each power load divided for each second period shorter than a first period into a plurality of groups, and the random number generation unit may generate the random number based on a total energization power amount of each power load in each group and a frequency of each total energization power amount in each group. According to the above configuration, a distribution situation of a total energization power amount of a power load in each group can be suitably reflected in a random number.

The information processing device may further include an output unit that outputs the generated virtual power load to a life prediction device that predicts a life of the energy storage device by using a virtual power load. The life prediction device uses a virtual power load, so that accuracy of life prediction may be improved and a wide range of life prediction is enabled.

In an information processing method, a computer executes processing of acquiring a plurality of representative power loads extracted from among power loads obtained by dividing a power load indicating time-series data of power of an energy storage device in a first period for each second period shorter than the first period, and generating a virtual power load in the first period by combining a plurality of acquired representative power loads.

A program causes a computer to execute processing of acquiring a plurality of representative power loads extracted from among power loads obtained by dividing a power load indicating time-series data of power of an energy storage device in a first period for each second period shorter than the first period, and generating a virtual power load in the first period by combining a plurality of acquired representative power loads.

Hereinafter, a specific example of the information processing device, the information processing method, and the program according to an embodiment of the present invention will be described with reference to the drawings. Note that the present invention is not limited to these examples, but is indicated by the claims, and is intended to include all changes within the meaning and scope equivalent to the claims. Further, at least some of embodiments described below may be optionally combined.

A sequence described in an embodiment below is not limited, and processing procedures may be executed in changed order within a range in which there is no contradiction, and a plurality of pieces of processing may be executed in parallel. A processing subject of each piece of processing is not limited, and processing of each device may be executed by another device within a range in which there is no contradiction. Further, in the present invention, an example and an analysis example of a power load are disclosed, but the present invention is not limited to a power load, and can be applied to other electric quantity and physical quantity in addition to parameters such as a current load and a polarization amount.

FIG. 1 is a diagram illustrating a configuration example of an information processing device 50. The information processing device 50 is communicably connected to a network 1 such as the Internet. The information processing device 50 can transmit and receive data to and from a plurality of power generating systems 100 via the network 1. The information processing device 50 may be integrated into any of the power generating systems 100.

The information processing device 50 is, for example, a server computer, a personal computer, a quantum computer, or the like, and performs various types of information processing and transmission and receiving of information. Details of the information processing device 50 will be described later.

Figure 2:
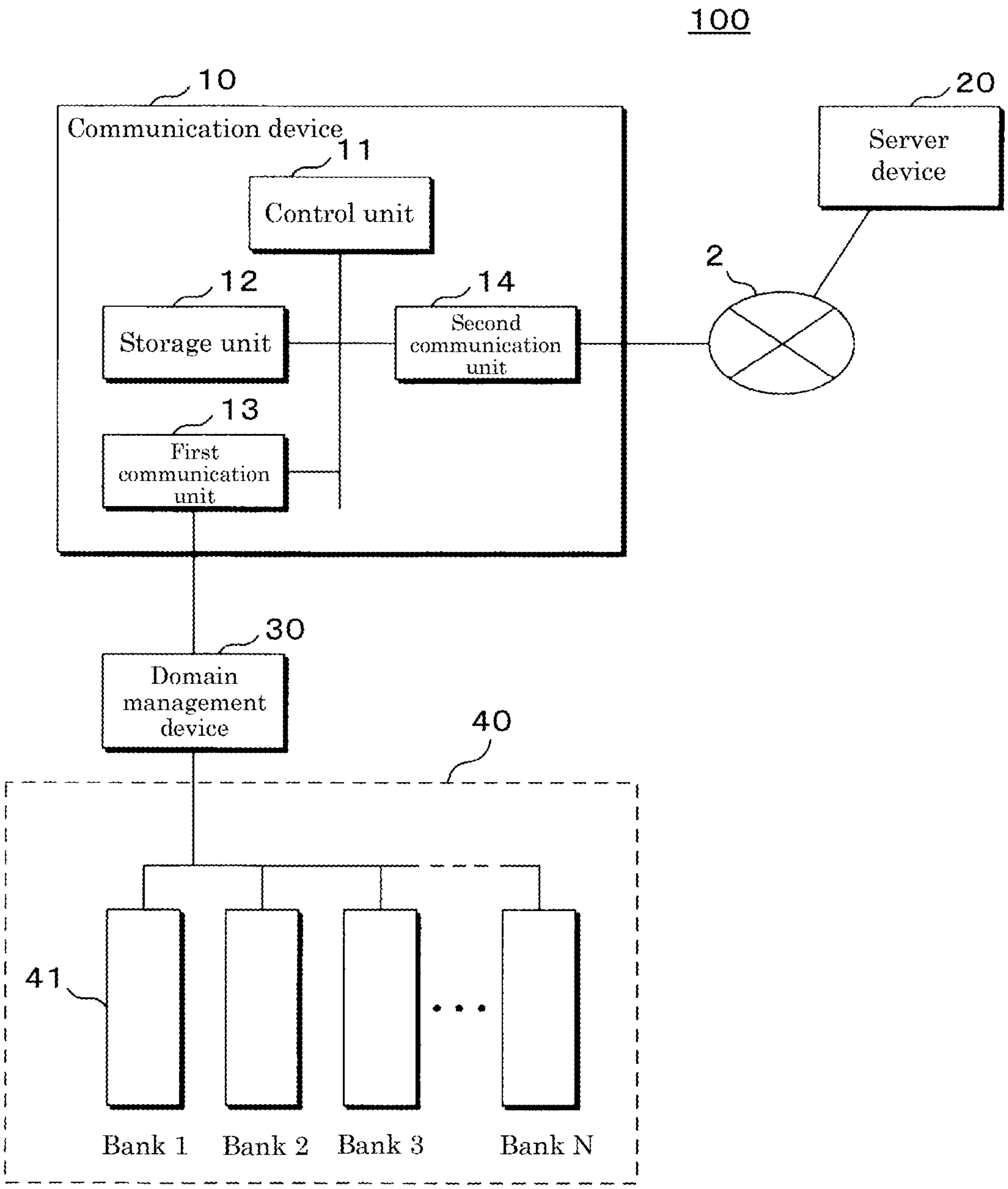
FIG. 2 is a diagram illustrating a configuration of a power generating system.

FIG. 2 is a diagram illustrating a configuration of the power generating system 100. The power generating system 100 includes a communication device 10, a server device 20 connected to the communication device 10 via a network 2, a domain management device 30, and an energy storage unit (domain) 40. The energy storage unit 40 may include a plurality of banks 41. The energy storage unit 40 is accommodated in, for example, a battery board and used for a thermal power generating system, a mega solar power generating system, a wind power generating system, an uninterruptible power system (UPS), a stabilized power supply system for a railway, and the like. A portion excluding a power conditioner (not illustrated) of the energy storage unit 40 may be referred to as a storage battery system. The energy storage unit 40 is not limited to an industrial application, and may be a household one.

The information processing device 50 and a plurality of the power generating systems 100 construct a remote monitoring system. The remote monitoring system enables remote access to information on an energy storage device included in the power generating system 100. A business operator performs a business of designing, introducing, operating, and maintaining an energy storage system including the communication device 10, the domain management device 30, and the energy storage unit 40, and can remotely monitor the energy storage system by the remote monitoring system.

The communication device 10 includes a control unit 11, a storage unit 12, a first communication unit 13, and a second communication unit 14. The control unit 11 includes a central processing unit (CPU) and the like, and controls the entire communication device 10 by using a built-in memory such as a read only memory (ROM) and a random access memory (RAM).

The storage unit 12 includes, for example, a non-volatile storage device such as a flash memory. The storage unit 12 can store necessary information, and for example, can store information obtained by processing of the control unit 11.

Figure 3:
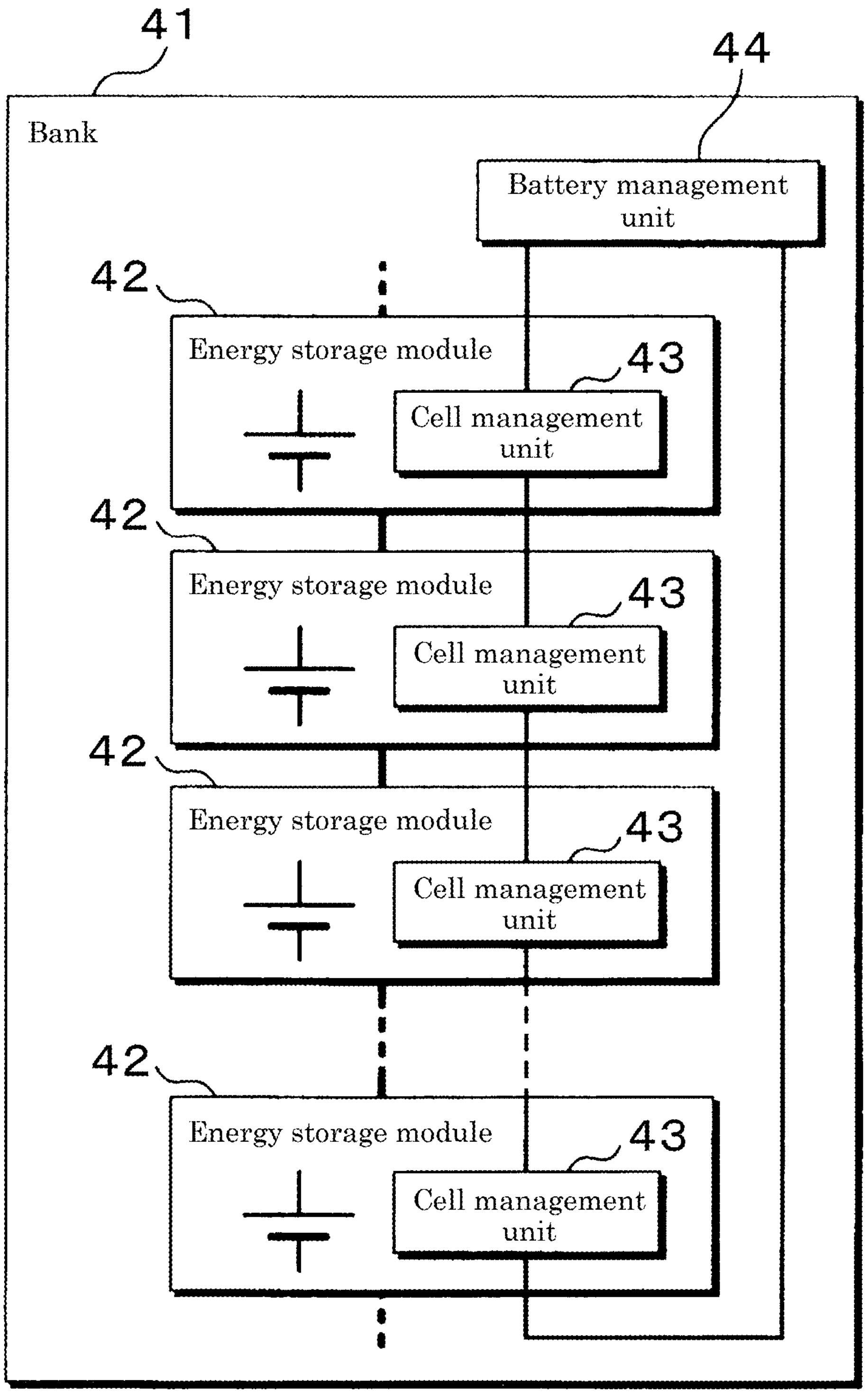
FIG. 3 is a diagram illustrating a configuration example of a bank.

The first communication unit 13 includes a communication interface that realizes communication with the domain management device 30 (or a battery management unit 44 illustrated in FIG. 3). The control unit 11 can communicate with the domain management device 30 through the first communication unit 13.

The second communication unit 14 includes a communication interface that realizes communication via the network 2. The control unit 11 can communicate with the server device 20 through the second communication unit 14.

The domain management device 30 transmits and receives information to and from each of the banks 41 by using a predetermined communication interface. The storage unit 12 can store operation data acquired via the domain management device 30.

The server device 20 can collect operation data of an energy storage system from the communication device 10. The operation data includes time series data such as a current value, a voltage value, and temperature data of each energy storage device in an energy storage system. The server device 20 stores the collected operation data by dividing the operation data for each energy storage device. The server device 20 can transmit the operation data to the information processing device 50 via the networks 2 and 1. Note that the networks 2 and 1 may be one communication network.

FIG. 3 is a diagram illustrating a configuration example of the bank 41. The bank 41 is formed by connecting a plurality of energy storage modules in series, and includes the battery management unit (BMU) 44, a plurality of energy storage modules 42, a cell management unit (CMU) 43 provided in each of the energy storage modules 42, and the like.

In the energy storage module 42, a plurality of energy storage cells are connected in series. In the present specification, the "energy storage device" may mean a domain in which an energy storage cell, the energy storage module 42, the bank 41, and the bank 41 are connected in parallel. In the present embodiment, the cell management unit 43 acquires energy storage device information on a state of each energy storage cell of the energy storage module 42. The energy storage device information includes, for example, voltage, current, temperature, a state of charge (SOC), SOH, and the like of an energy storage cell. The energy storage device information can be repeatedly acquired at an appropriate cycle of, for example, 0.1 seconds, 0.5 seconds, 1 second, or the like. Data in which the energy storage device information is accumulated is a part of the operation data. The "energy storage device" is preferably a rechargeable one, such as a secondary battery such as a lead-acid battery and a lithium ion battery or a capacitor. A part of the energy storage device may be a non-rechargeable primary battery.

The battery management unit 44 can communicate with the cell management unit 43 having a communication function by serial communication, and can acquire the energy storage device information detected by the cell management unit 43. The battery management unit 44 can transmit and receive information to and from the domain management device 30. The domain management device 30 aggregates the energy storage device information from the battery management unit 44 of a bank belonging to a domain. The domain management device 30 outputs the aggregated energy storage device information to the communication device 10. In this manner, the communication device 10 can acquire the operation data of the energy storage unit 40 via the domain management device 30. The communication device 10 transmits the acquired operation data to the information processing device 50 via the server device 20.

As illustrated in FIG. 1, the information processing device 50 includes a control unit 51, a storage unit 52, and a communication unit 53. The information processing device 50 may be a multi-computer including a plurality of computers, or may be a virtual machine virtually constructed by software.

The control unit 51 is an arithmetic circuit including a CPU, a graphics processing unit (GPU), a ROM, a RAM, and the like. A CPU or GPU included in the control unit 51 executes various computer programs stored in a ROM or the storage unit 52, and controls operation of each unit of the hardware described above. The control unit 51 may have a function of a timer that measures elapsed time from when a measurement start instruction is given to when a measurement end instruction is given, a counter that counts the number, a clock that outputs date and time information, and the like.

The storage unit 52 is a non-volatile storage device such as a flash memory. The storage unit 52 stores a program and data referred to by the control unit 51. A computer program stored in the storage unit 52 includes a program 521 for executing processing relating to a power load of an energy storage device.

Data stored in the storage unit 52 includes the operation data received from the power generating system 100. As described above, the operation data includes time series data of a current value and a voltage value of an energy storage device in the power generating system 100. The control unit 51 collects the operation data in each of the power generating systems 100 and accumulates the operation data in the storage unit 52 as big data. The control unit 51 performs processing of acquiring a representative power load of an energy storage device and processing of generating a virtual power load based on the accumulated actual operation data of the energy storage device.

A computer program (computer program product) stored in the storage unit 52 may be provided by a non-transitory recording medium M in which the computer program is recorded in a readable manner. The recording medium M is a portable memory such as a CD-ROM, a USB memory, or a secure digital (SD) card. The control unit 51 reads a desired computer program from the recording medium M by using a reading device (not illustrated), and stores the read computer program in the storage unit 52. Alternatively, the computer program may be provided by communication. The program 521 may include a single computer program or a plurality of computer programs, and may be executed on a single computer or may be executed on a plurality of computers interconnected by a communication network.

The communication unit 53 includes a communication interface that realizes communication via the network 1. The control unit 51 can communicate with an external device through the communication unit 53. Examples of the external device communicably connected to the communication unit 53 include the power generating system 100 and a life prediction device that predicts a life of an energy storage device. In a case where information on a power load of an energy storage device is obtained, the control unit 51 transmits the obtained information from the communication unit 53 to a life prediction device. The life prediction device receives the information transmitted from the communication unit 53, and predicts a life of the energy storage device based on the received information.

The information processing device 50 may further include, for example, an input unit that receives operation input, a display unit that displays an image, and the like.

Figure 4:
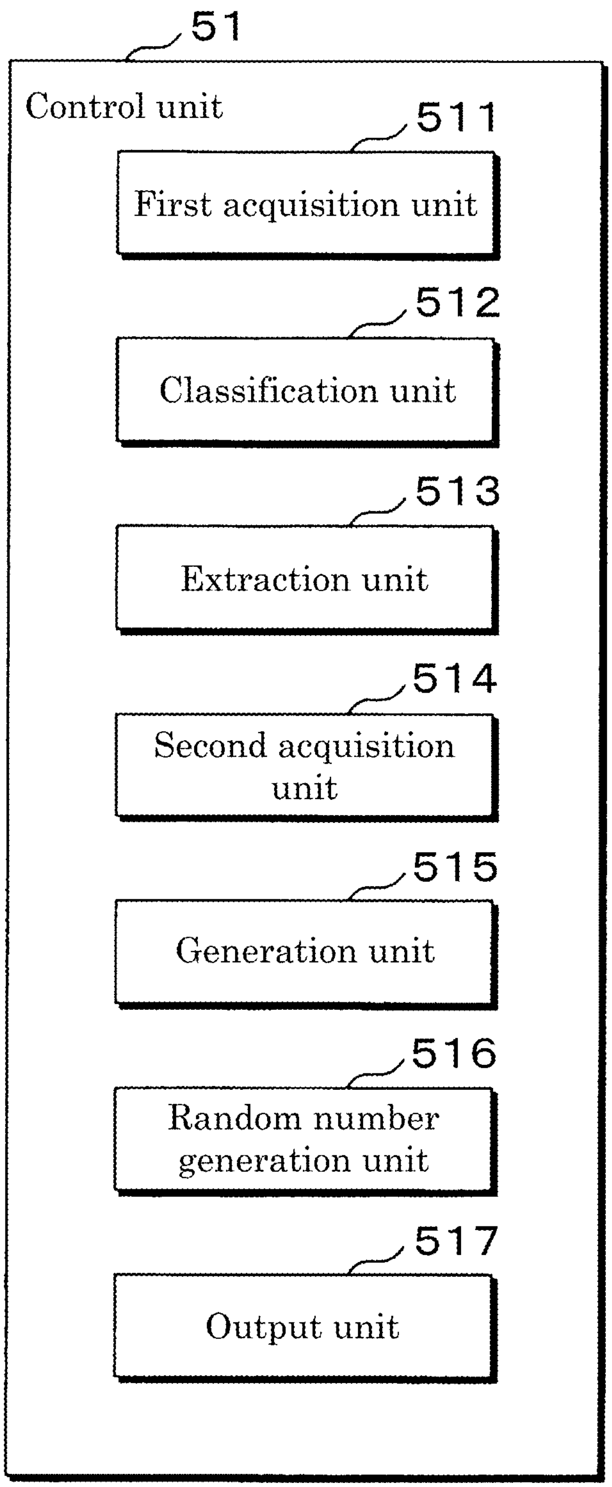
FIG. 4 is a functional block diagram illustrating a configuration example of the information processing device.

FIG. 4 is a functional block diagram illustrating a configuration example of the information processing device 50. The control unit 51 of the information processing device 50 functions as a first acquisition unit 511, a classification unit 512, an extraction unit 513, a second acquisition unit 514, a generation unit 515, a random number generation unit 516, and an output unit 517 by reading and executing the program 521 stored in the storage unit 52.

Figure 5:
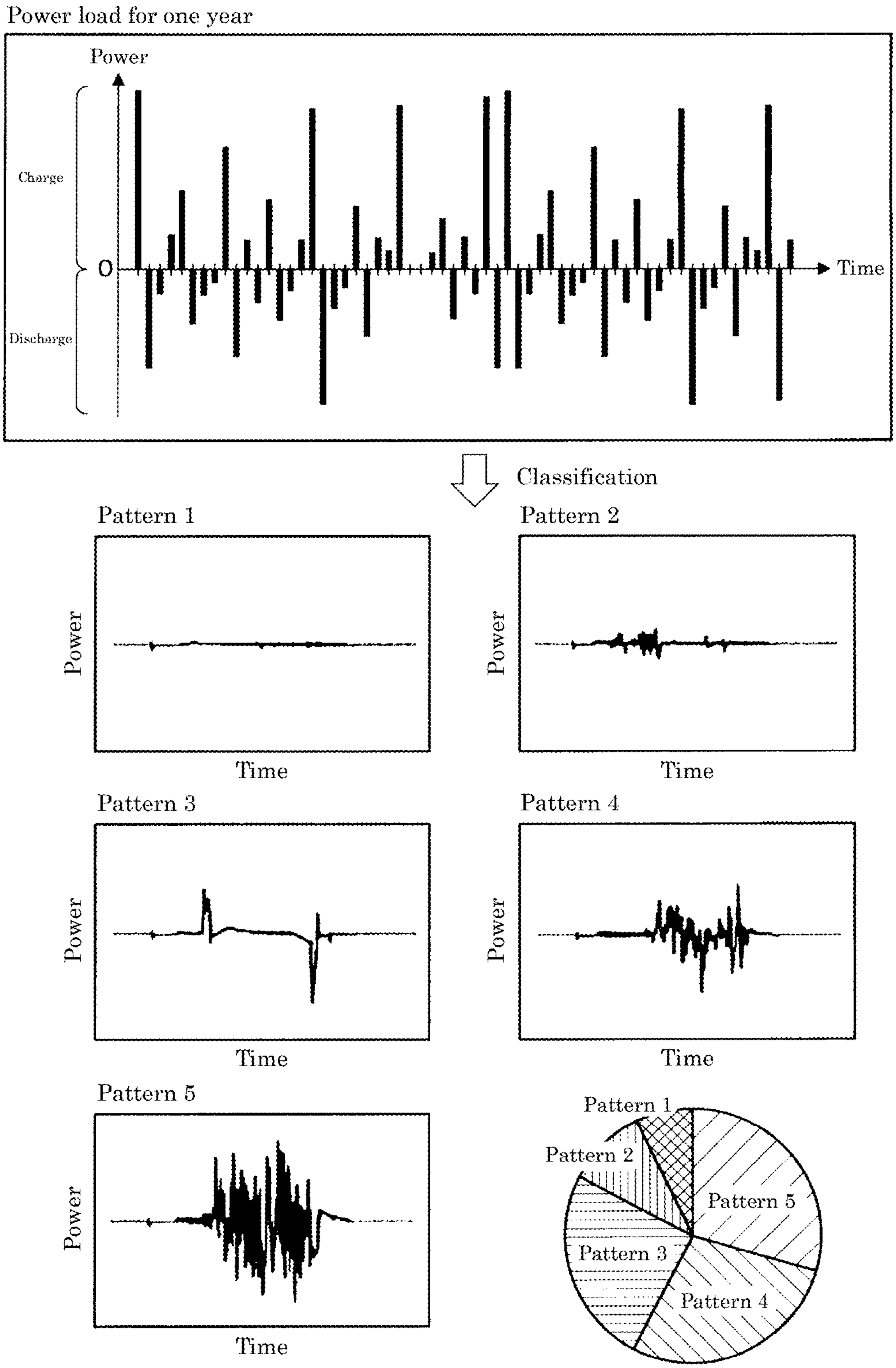
FIG. 5 is a diagram for explaining a method of extracting a representative power load and a method of generating a virtual power load.
Figure 6:
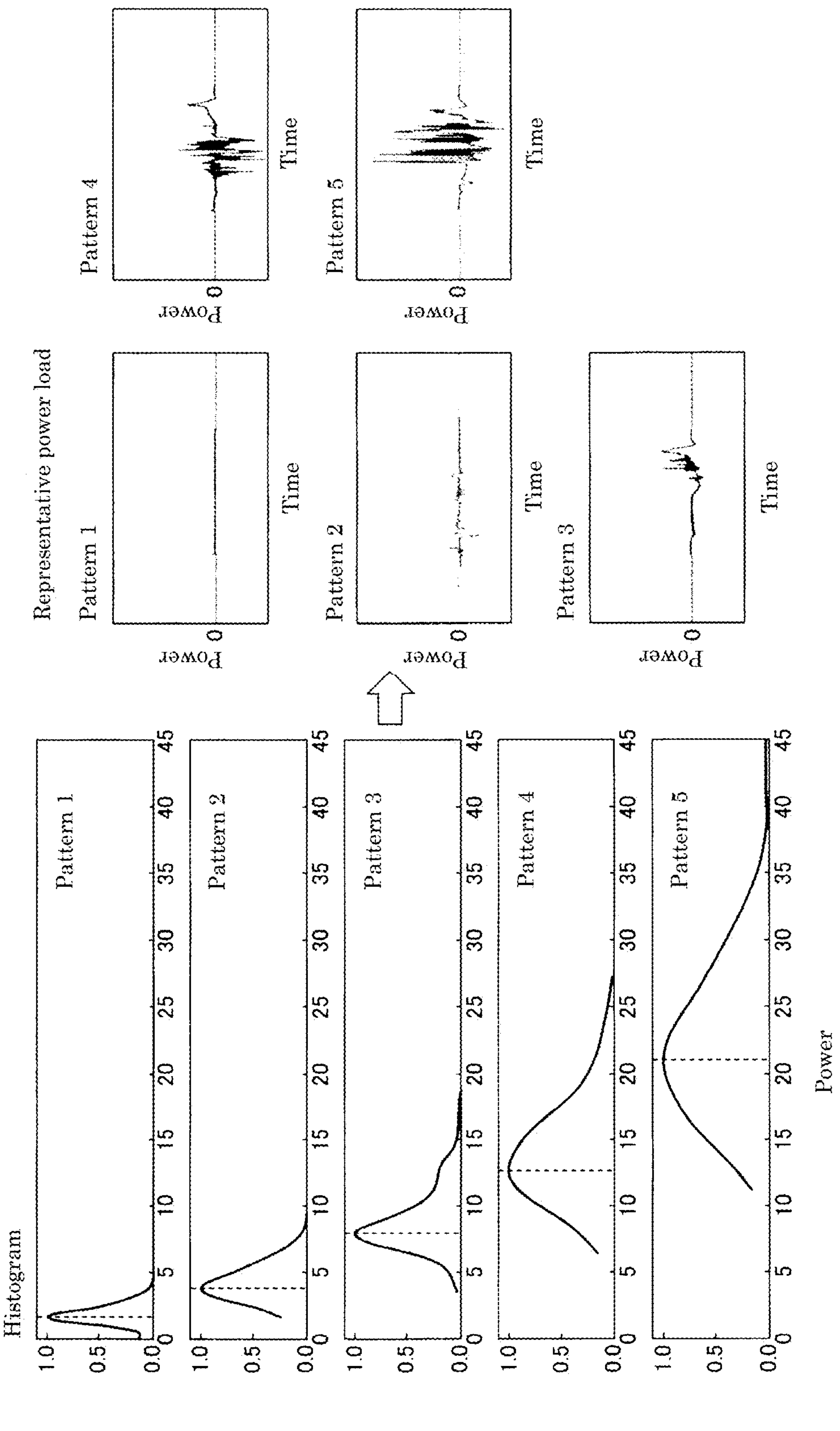
FIG. 6 is a diagram for explaining a method of extracting a representative power load and a method of generating a virtual power load.
Figure 7:
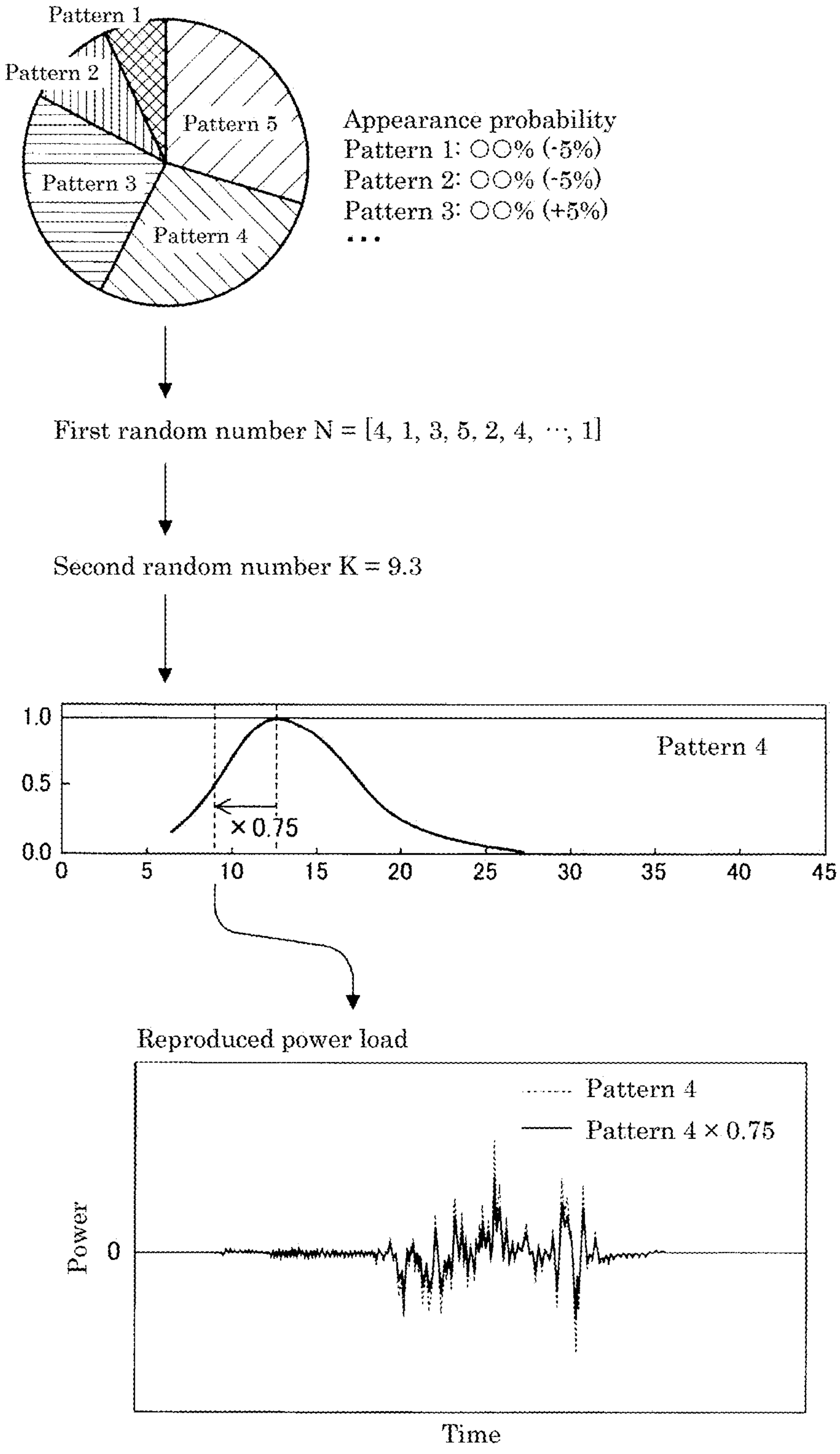
FIG. 7 is a diagram for explaining a method of extracting a representative power load and a method of generating a virtual power load.

FIGS. 5 to 7 are diagrams for explaining a method of extracting a representative power load and a method of generating a virtual power load. The method of extracting a representative power load and the method of generating a virtual power load in the present embodiment will be specifically described with reference to FIGS. 5 to 7, and a function of each functional unit of the control unit 51 will be described.

The first acquisition unit 511 receives time-series data of a current value, a voltage value, and temperature in the power generating system 100 over a first period from the server device 20 via the communication unit 53. The time-series data of a current value and a voltage value is data at the time of charge or discharge of an energy storage device.

The first acquisition unit 511 calculates power that is a multiplied value of a current value and a voltage value based on the acquired time-series data of a current value and a voltage value, and acquires a power load indicating time-series data of the power. For example, the first acquisition unit 511 may acquire a power load in an aspect of a graph in which time-series data of power of an energy storage device in a first period is plotted. An example of a graph of a power load for one year is illustrated on the upper side of FIG. 5. In the graph of FIG. 5, the vertical axis represents power, and the horizontal axis represents time (period). The positive side of the vertical axis represents charge, and the negative side represents discharge.

The first acquisition unit 511 may collectively acquire a power load over the first period, or may acquire a power load in the first period by continuously collecting a power load in each predetermined period. The first acquisition unit 511 stores the acquired power load and temperature data in the storage unit 52. The first acquisition unit 511 may directly acquire a power load (time-series data of power) from the server device 20.

The classification unit 512 divides a power load in a first period acquired by the first acquisition unit 511 into second periods shorter than the first period. Hereinafter, as an example, it is assumed that the first period is one year and the second period is one day. Further, hereinafter, a power load for each second period, that is, a power load in each of divided regions divided for each second period is also referred to as a short-term power load. The classification unit 512 classifies short-term power loads into a plurality of groups.

The classification unit 512 classifies a plurality of short-term power loads obtained by dividing a power load for one year into one or more groups (patterns). A classification method of short-term power loads is not particularly limited, but for example, a classification model such as a k-means method or a Gaussian mixture model can be used. The classification model is a machine learning model based on a clustering algorithm. By the classification model, a plurality of short-term power loads are classified into a plurality of clusters based on a correlation of a feature amount of the short-term power loads. Note that the classification model may be a model based on another learning algorithm such as a neural network, a support vector machine (SVM), or a decision tree.

The classification unit 512 may classify a short-term power load by a rule-based method. The classification unit 512 classifies each short-term power load into a predetermined group based on, for example, the number of times of switching in a charge-discharge direction in a power load for one day, a total value of an amount of change in a power value (absolute value of a power value in the vertical axis direction), a total value of charge-discharge time, and the like.

An example of a classification pattern is illustrated on the lower side of FIG. 5. In the example of FIG. 5, each short-term power load is classified into five groups corresponding to Pattern 1 to Pattern 5. Short-term power load data having a relatively small change in power amount is classified into Pattern 1, and a change in power amount becomes larger as the number assigned to the patterns becomes larger.

A circular graph on the lower right side of FIG. 5 indicates appearance probability of each pattern. The appearance probability of each pattern means probability (existence probability) that a short-term power load belonging to each pattern appears in an entire power load of one year. In the example illustrated in FIG. 5, Pattern 5 has highest appearance probability, and Pattern 1 has lowest appearance probability.

The extraction unit 513 extracts a representative power load representing a power load pattern of a group from among short-term power loads included in the same group for each group classified by the classification unit 512. As illustrated in FIG. 6, the extraction unit 513 extracts a representative power load by using a histogram of a total energization power amount.

The extraction unit 513 calculates a total energization power amount in one day for all short-term power loads belonging to a group as an extraction target (for example, Pattern 1). The total energization power amount is obtained by time-integrating power for one day based on time-series data of power in a short-term power load. The extraction unit 513 generates a histogram showing distribution of total energization power amounts as illustrated on the lower side of FIG. 6 based on the calculated total energization power amount. The extraction unit 513 may use, for example, kernel density estimation in estimation of distribution of total energization power amounts. By the above, a histogram represented by a continuous curve as illustrated in FIG. 6 can be generated.

The extraction unit 513 extracts a representative power load based on a mode of a total energization power amount in a group of Pattern 1. Specifically, the extraction unit 513 identifies a short-term power load corresponding to a peak of a histogram of Pattern 1, and extracts the identified short-term power load as a representative power load of Pattern 1. The extraction unit 513 may extract a representative power load based on a mode of a total energization power amount, and may estimate distribution of total energization power amounts by a method other than a histogram.

The extraction unit 513 normalizes a value of a frequency on the vertical axis of a histogram such that a frequency corresponding to the identified representative power load becomes one. The extraction unit 513 acquires a histogram and a representative power load for each group as illustrated in FIG. 6 by executing the above-described processing for each group. The extraction unit 513 stores the extracted representative power load and the generated histogram in the storage unit 52.

By the above-described processing, a representative power load in an energy storage device can be acquired. The acquired representative power load can be effectively used for analysis of an energy storage device as data appropriately expressing current usage of the energy storage device. Furthermore, in the present embodiment, a virtual power load assuming a case where usage of an energy storage device is changed is generated based on the acquired representative power load. Hereinafter, a method of generating a virtual power load will be described with reference to FIG. 7.

The second acquisition unit 514 acquires a representative power load of each group extracted by the extraction unit 513 by reading information stored in the storage unit 52.

The generation unit 515 generates a virtual power load for one year by combining representative power loads acquired by the second acquisition unit 514. In generation of a virtual power load, the generation unit 515 combines representative power loads by using virtual appearance probability in each representative power load and a random number received from the random number generation unit 516 described later.

The virtual appearance probability in each representative power load can be optionally set. For example, by assuming a change in usage of an energy storage device in the future, appearance probability of each pattern in the operation data may be appropriately increased or decreased. The generation unit 515 may acquire appearance probability by receiving input from the user or by receiving appearance probability transmitted from an external device. The generation unit 515 may automatically generate appearance probability by changing the operation data according to a predetermined rule. The generation unit 515 may use appearance probability in the operation data directly as virtual appearance probability without changing the appearance probability.

The random number generation unit 516 generates two types of random numbers of a first random number N and a second random number K. The random number generation unit 516 generates the first random number N based on a classification result of each short-term power load. The first random number N can be expressed as described below as an example.

First random number N=[4, 1, 3, 5, 2, 4, . . . , 1]

A length of the first random number N corresponds to a ratio of the first period to the second period (first period/second period). In the present embodiment, since the second period is one year (365 days) and the second period is one day, a length of the first random number N is 365/1=365. An element of the first random number N corresponds to data indicating a group type. In the present embodiment, elements of the first random number N are one to five, and correspond to Pattern 1 to Pattern 5 in numerical order. A ratio of each element in the entire elements in the first random number N corresponds to appearance probability of a representative power load belonging to a pattern corresponding to each element. Appearance probability of a representative power load is virtual appearance probability acquired in generating a virtual power load.

The random number generation unit 516 further generates the second random number K based on a representative power load selected using the first random number N as an argument. For example, when a representative power load of Pattern 4 is selected as a first representative power load based on the first random number, the random number generation unit 516 reads a histogram of Pattern 4. The random number generation unit 516 generates the second random number K based on the histogram.

A length of the second random number K is one. An element of the second random number K corresponds to a value of a total energization power amount in a histogram. As an example, an element of the second random number K can be a value in increments of a predetermined value (for example, 0.1 kW) between a minimum value and a maximum value of a total energization power amount. Proportion of each element in the entire elements in the second random number K corresponds to a frequency in a histogram of a total energization power amount corresponding to each element. A frequency of each total current power amount is normalized from zero to one in advance as described above.

The random number generation unit 516 generates the second random number K for each element of the first random number N. The random number generation unit 516 outputs the generated first random number N and second random number K to the generation unit 515.

The generation unit 515 combines representative power loads by using the first random number N and the second random number K received from the random number generation unit 516. For example, it is assumed that first one of the first random number N=4 and the second random number K=9.3 which corresponds to this first random number. The generation unit 515 selects a representative power load of Pattern 4 corresponding to the first random number N=4 by using the first random number N as an argument. The generation unit 515 reads a representative power load and a histogram of the selected Pattern 4.

The generation unit 515 generates a new power load (hereinafter, also referred to as a reproduced power load) by changing a representative power load of Pattern 4 based on the second random number K. As illustrated on the lower side of FIG. 7, the reproduced power load is obtained by enlarging or reducing a representative power load according to a ratio calculated based on the second random number K. The ratio can be a ratio of a total current power amount indicated by the second random number K to a total current power amount of a representative power load (total current power amount of the second random number K/total current power amount of the representative power load). The generation unit 515 calculates the ratio based on a histogram of Pattern 4. For example, it is assumed that the calculated ratio=0.75. The generation unit 515 generates a reproduced load obtained by reducing a representative power load by 0.75 times in a power direction.

The generation unit 515 repeats the above-described processing for each element of the first random number N to generate a reproduced load for one year. The generation unit 515 generates a virtual power load for one year by connecting all the generated reproduced loads.

The generation unit 515 may generate a plurality of virtual power loads in which appearance probability of each representative power load is made different by acquiring a plurality of virtual appearance probabilities. By setting appearance probability corresponding to various power usages, it is possible to generate a virtual power load according to various use aspects.

The output unit 517 transmits a virtual power load generated by the generation unit 515 to an external device such as a life prediction device via the communication unit 53. Alternatively, the information processing device 50 and a life prediction device may be configured as one common processing device, and the output unit 517 may output a virtual power load to the life prediction device in the information processing device 50.

Figure 8:
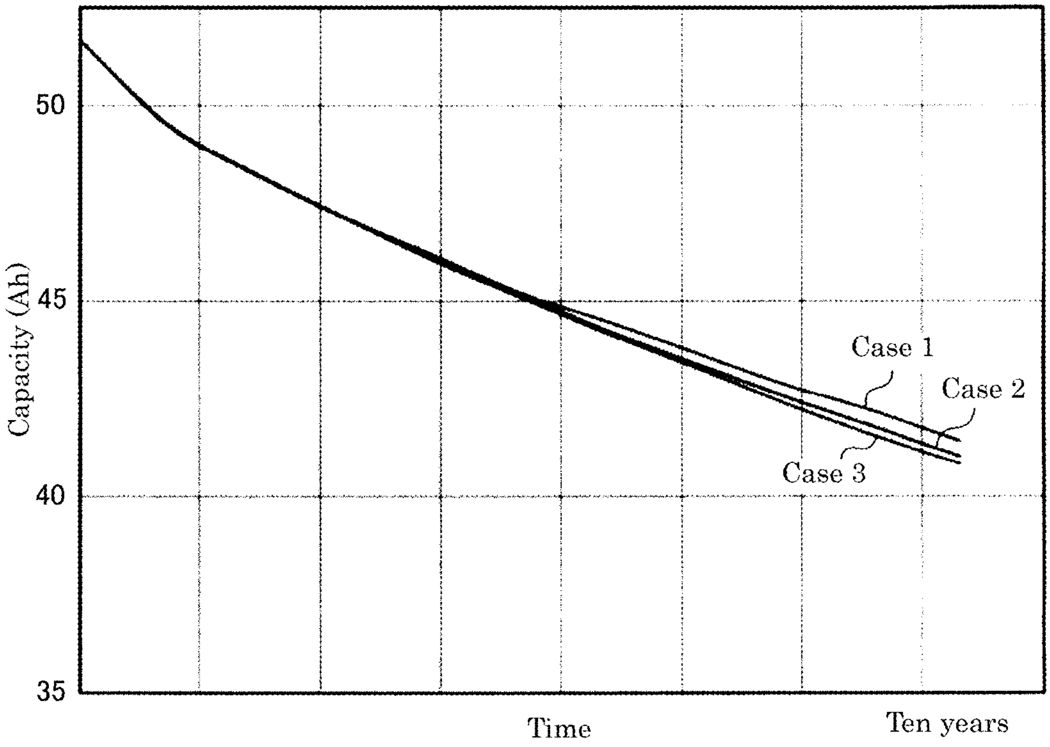
FIG. 8 is a diagram illustrating an estimation result of capacity transition when a power load is changed.

FIG. 8 is a diagram illustrating an estimation result of capacity transition in a case where a power load is changed. In the graph shown in FIG. 8, the vertical axis represents capacity (Ah) of an energy storage device, and the horizontal axis represents time. Curves shown in the graph indicate estimation results from a first year to a tenth year for each of Case 1, Case 2, and Case 3 in this order from the top.

In Case 1, actual measurement data of a power load for one year obtained from the operation data was used without any change over the entire period from the first year to the tenth year. In Case 2, the actual measurement data was used from the first year to the third year, and from the fourth year to the tenth year, appearance probability of Pattern 1 and Pattern 2 in the actual measurement data was decreased by 5% and appearance probability of Pattern 3 and Pattern 4 was increased by 5%. In Case 3, the actual measurement data was used from the first year to the third year, and from the fourth year to the tenth year, appearance probability of Pattern 1 and Pattern 2 in the actual measurement data was set to 0% and appearance probability of Pattern 4 and Pattern 5 was increased. In Case 3, an increasing rate of Pattern 4 corresponds to a decreasing rate of Pattern 2, and an increasing rate of Pattern 5 corresponds to a decreasing rate of Pattern 1.

Estimated capacity in the tenth years was 0.05 (Ah) lower in Case 2 than in Case 1, and 0.6 (Ah) lower in Case 3 than in Case 1. As described above, by changing appearance probability in a virtual power load, it is possible to change estimated capacity and estimate a wide range of capacity transition.

Figure 9:
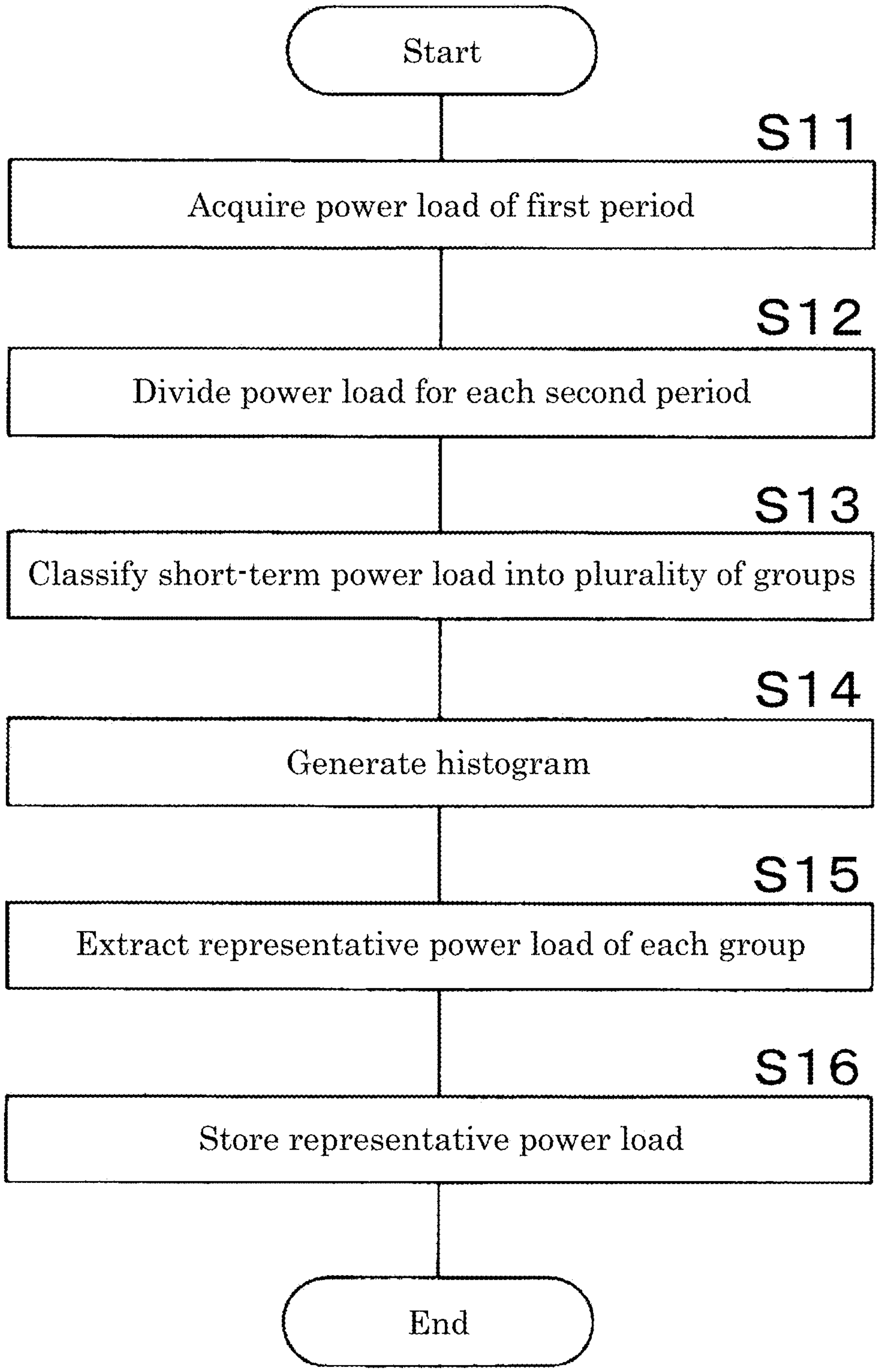
FIG. 9 is a flowchart showing an example of a processing procedure of acquiring a representative power load.

FIG. 9 is a flowchart illustrating an example of a processing procedure of acquiring a representative power load. Processing in each flowchart below may be executed by the control unit 51 according to the program 521 stored in the storage unit 52 of the information processing device 50, may be realized by a dedicated hardware circuit (for example, FPGA or ASIC) provided in the control unit 51, or may be realized by a combination of these.

The control unit 51 of the information processing device 50 acquires time-series data of current and voltage of an energy storage device in the first period, and acquires a power load indicating time-series data of power in the first period based on the acquired time-series data of current and voltage (Step S11).

The control unit 51 divides the acquired power load in the first period for each second period (Step S12) and generates a plurality of short-term power loads. The control unit 51 classifies each of the short-term power loads into a plurality of groups by using, for example, a classification model (Step S13).

The control unit 51 calculates, for each group, a total energization power amount in the second period in all the short-term power loads belonging to the group, so as to generate a histogram indicating distribution of total energization power amounts (Step S14).

The control unit 51 extracts a representative power load for each group (Step S15). Specifically, the control unit 51 identifies a mode of total energization power amounts in each group, that is, a short-term power load corresponding to a peak of the histogram, and extracts the identified short-term power load as a representative power load. The control unit 51 normalizes a frequency value on the vertical axis of the histogram so that a frequency corresponding to the identified representative power load becomes one.

The control unit 51 stores the extracted representative power load for each group and the generated histogram in the storage unit 52 (Step S16), and ends a series of processing. The control unit 51 may output the extracted representative power load to an external device or the like.

Figure 10:
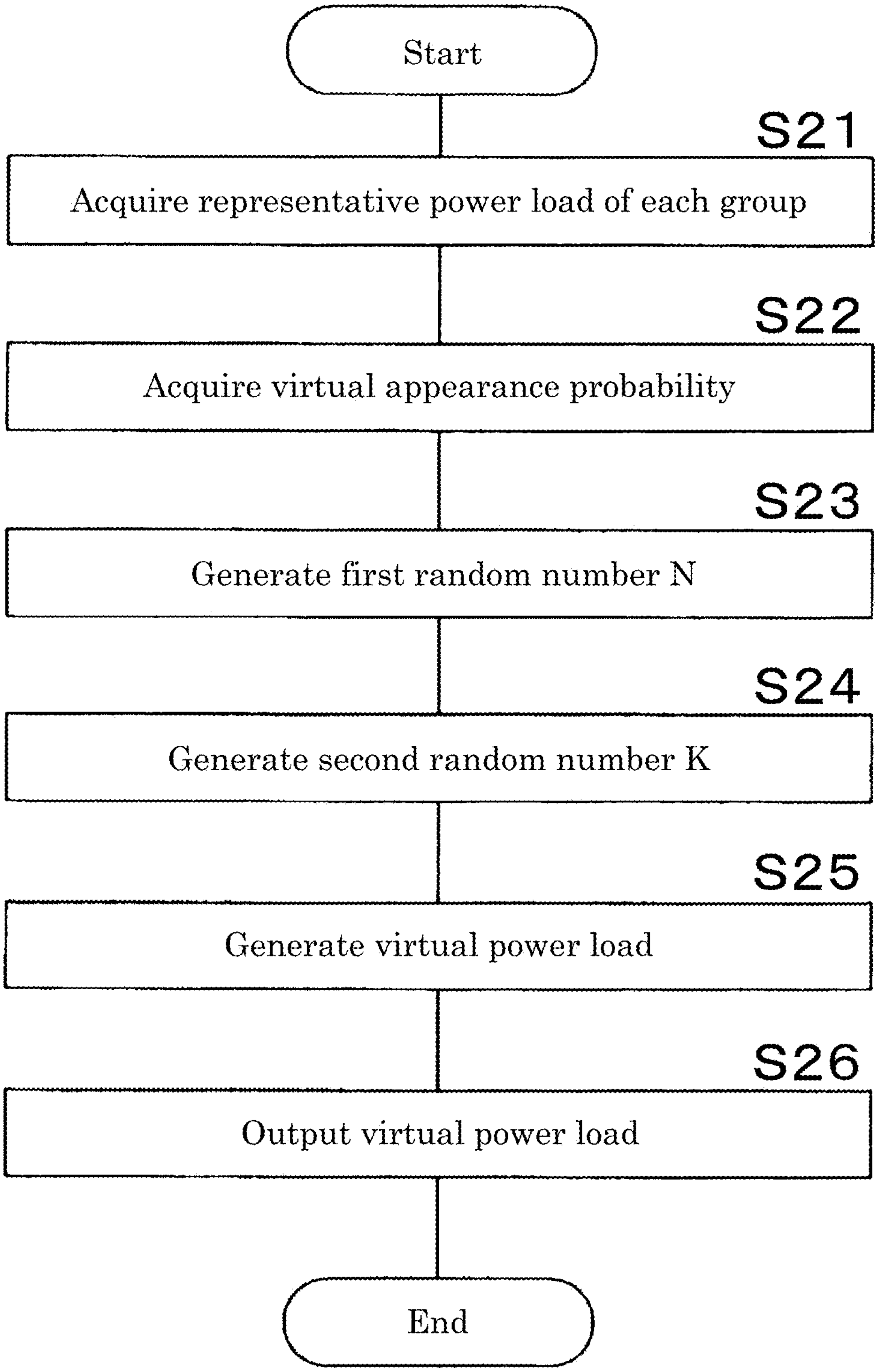
FIG. 10 is a flowchart illustrating an example of a processing procedure of generating a virtual power load.

FIG. 10 is a flowchart illustrating an example of a processing procedure of generating a virtual power load.

The control unit 51 of the information processing device 50 acquires a representative power load for each group based on information stored in the storage unit 52 (Step S21).

The control unit 51 acquires virtual appearance probability in the first period of each representative power load (Step S22). For example, the control unit 51 may acquire virtual appearance probability by receiving input from the user. The control unit 51 may acquire virtual appearance probability of a plurality of patterns.

The control unit 51 generates the first random number N based on a length of the first period with respect to a length of the second period, a type of a representative power load, and the appearance probability of each representative power load acquired in Step S22 (Step S23). The control unit 51 generates the second random number K based on distribution of total energization power amounts of a power load in each group and a frequency of each total energization power amount in each group (Step S24).

The control unit 51 generates a virtual power load in the first period by combining representative power loads by using the first random number N and the second random number K (Step S25). Specifically, the control unit 51 sequentially selects representative power loads by using the first random number N as an argument. The control unit 51 generates a reproduced load in which the selected representative power load is changed at a predetermined ratio in a power direction based on the second random number K. The control unit 51 generates a virtual power load in the first period by combining the generated reproduced load of each second period.

In Step S25, in a case of acquiring a setting value of appearance probability of a plurality of patterns, the control unit 51 generates a virtual power load of a plurality of patterns corresponding to a setting value of each appearance probability.

The control unit 51 outputs the generated virtual power load to a life prediction device or the like (Step S26), and ends a series of processing.

According to the present embodiment, it is possible to acquire and provide a representative power load useful for analysis of an energy storage device. By generating a virtual power load by using a representative power load, it is possible to efficiently and accurately perform life prediction. By changing appearance probability of each representative power load in a virtual power load, it is possible to generate a virtual power load according to various use aspects. By using a virtual power load, it is possible to suitably express various power loads in a case where usage of an energy storage device changes, and it is possible to perform a wide range of life prediction.

The invention claimed is:

1. An information processing device comprising:

a non-transitory computer-readable medium that stores a program; and a processor configured to execute the program and cause the information processing device to:

acquire a power load indicating time-series data of power of an energy storage device in a first period, classify each power load obtained by dividing the power load acquired for each second period shorter than the first period into a plurality of groups, extract, for each group classified, a representative power load from among power loads for each second period belonging to each group, generate a virtual power load for the first period by combining the representative power loads, wherein the time-series data is acquired based on detection signals output from at least one of a current sensor and a voltage sensor electrically coupled to the energy storage device, and wherein the processor outputs the generated virtual power load to a battery life prediction device and the virtual power load is used as an input load condition for predicting degradation of the energy storage device.

2. The information processing device according to claim 1, wherein the classifying each power load for each second period into the plurality of groups is by using a classification model generated by machine learning of a plurality of power loads.

3. The information processing device according to claim 1, wherein the representative power load is extracted based on a mode of a total energization power amount of a power load in each second period in each group.

4. An information processing method in which a computer executes processing steps of:

acquiring a power load indicating time-series data of power of an energy storage device in a first period;

classifying each power load obtained by dividing the acquired power load for each second period shorter than the first period into a plurality of groups;

extracting, for each classified group, a representative power load from among power loads for each second period belonging to each group:

generating a virtual power load for the first period by combining the representative power loads; and outputting the generated virtual power load to a battery life prediction device and the virtual power load is used as an input load condition for predicting degradation of the energy storage device, wherein the time-series data is acquired based on detection signals output from at least one of a current sensor and a voltage sensor electrically coupled to the energy storage device.

5. An information processing device comprising:

a control unit has a storage and a processor at least configure to:

acquire a plurality of representative power loads extracted from among power loads obtained by dividing a power load indicating time-series data of power of an energy storage device in a first period for each second period shorter than the first period; and generate a virtual power load in the first period by combining the plurality of representative power loads acquired, wherein the time-series data is acquired based on detection signals output from at least one of a current sensor and a voltage sensor electrically coupled to the energy storage device, and wherein the processor outputs the generated virtual power load to a battery life prediction device and the virtual power load is used as an input load condition for predicting degradation of the energy storage device.

6. The information processing device according to claim 5, wherein the processor further combines each representative power load based on appearance probability of each representative power load in the first period.

7. The information processing device according to claim 5, wherein the processor further generates a plurality of patterns of virtual power loads by varying appearance probability of each representative power load in the first period.

8. The information processing device according to claim 5, wherein the processor further generates a random number, and combines the representative power load based on the generated random number.

9. The information processing device according to claim 8, wherein the random number is generated based on a length of the first period with respect to a length of the second period, a type of the representative power load, and appearance probability in the first period of each representative power load.

10. The information processing device according to claim 9, wherein the representative power load is extracted for each group obtained by classifying each power load divided for each second period shorter than the first period into a plurality of groups, and the random number is generated based on a total energization power amount of each power load in each group and a frequency of each total energization power amount in each group.

11. The information processing device according to claim 5, wherein the processor further outputs the generated virtual power load to a life prediction device that predicts a life of the energy storage device by using the virtual power load.

12. An information processing method in which a computer executes processing steps of:

acquiring a plurality of representative power loads extracted from among power loads obtained by dividing a power load indicating time-series data of power of an energy storage device in a first period for each second period shorter than the first period;

generating a virtual power load in the first period by combining the plurality of acquired representative power loads; and outputting the generated virtual power load to a battery life prediction device and the virtual power load is used as an input load condition for predicting degradation of the energy storage device, wherein the time-series data is acquired based on detection signals output from at least one of a current sensor and a voltage sensor electrically coupled to the energy storage device.

* * * * *